United States Patent [19]

Balde

[11] 4,258,468

[45] Mar. 31, 1981

[54] FORMING VIAS THROUGH MULTILAYER CIRCUIT BOARDS

[75] Inventor: John W. Balde, Flemington, N.J.

[73] Assignee: Western Electric Company, Inc., New York, N.Y.

[21] Appl. No.: 969,621

[22] Filed: Dec. 14, 1978

[51] Int. Cl.³ .............................................. H05K 3/36
[52] U.S. Cl. ..................... 29/830; 174/68.5; 427/97
[58] Field of Search ................ 29/625; 174/68.5; 427/97; 29/830

[56] References Cited

U.S. PATENT DOCUMENTS

| 3,562,009 | 2/1971 | Cranston et al. | 427/97 X |
| 3,672,986 | 6/1972 | Schneble, Jr. et al. | 174/68.5 X |

FOREIGN PATENT DOCUMENTS

| 1262395 | 3/1968 | Fed. Rep. of Germany | 29/625 |
| 1379558 | 1/1975 | United Kingdom | 29/625 |
| 1425373 | 2/1976 | United Kingdom | 29/625 |

OTHER PUBLICATIONS

IBM Tech. Discl. Bull., vol. 8, No. 3, Aug. 1965, pp. 419, 434.
Am. Ceram. Soc. Bull., vol. 50, No. 3, 1971, p. 251ff.
IBM Technical Disl., vol. 9, No. 12 (5/67), p. 1679.

Primary Examiner—Francis S. Husar
Assistant Examiner—C. J. Arbes
Attorney, Agent, or Firm—D. J. Kirk

[57] ABSTRACT

A via (21) is formed in a multilayer printed circuit board (10) by initially etching apertures (14) in the land areas (13) of the circuit pattern on the layers (11) prior to uniting the layers. A beam (16) of laser energy is then directed through the apertures to form a via through the printed circuit board. Each via is defined by the apertures in a plurality of vertically aligned land areas. The via is then electrolessly plated to provide electrical connections between vertically aligned land areas.

3 Claims, 9 Drawing Figures

FORMING VIAS THROUGH MULTILAYER CIRCUIT BOARDS

TECHNICAL FIELD

This invention relates to the forming of vias through circuit boards. More particularly, the invention is directed to methods which employ lasers to form vias through circuit boards, as well as to circuit board structures suitable for the drilling of the vias therethrough.

BACKGROUND OF THE INVENTION

It is known to form conductor patterns on one or both sides of a number of individual layers of dielectric material, and then to stack and unite such patterned layers to produce a multilayer circuit board. A typical dielectric material used in such multilayer circuit boards is an epoxy-glass material, while the conductor pattern is generally formed from copper, e.g., by selective etching of a thin layer of copper initially covering a layer of the epoxy-glass material. The conductor pattern is comprised of a multitude of fine line paths which terminate on relatively large surface land areas.

In order to provide electrical connections between vertically aligned land areas on the stacked layers, vias are drilled through the multilayer board at the central portions of the land areas and an electrically conductive material such as electroless plated copper is deposited in the via to make the desired interlayer connection. Vias 40 mils or greater in diameter can be accomplished easily with existing mechanical drills. However, with the advent of large-scale integration of circuits, greater density of inteconnection requires smaller diameter land areas (e.g., 25 mils) and smaller diameter vias (e.g., 10 to 15 mils). However, mechanical drills 10 to 15 mils in diameter are extremely fragile and subject to breakage which requires time-consuming and expensive replacement or repair.

One possible solution to the problem of drilling small diameter vias is the implementation of laser drilling. It is well-known to drill small diameter holes in epoxy-glass substrates using a $CO_2$ laser; however, the wavelength (10.6 $\mu$m) of that laser is reflected by copper, therefore, holes cannot be readily drilled therethrough. A YAG laser could be used to drill apertures in the copper, but that laser is not effective for drilling through the epoxy-glass insulation. Thus, by alternately using a YAG laser to drill through the copper layers and the $CO_2$ laser to drill thrugh the epoxy-glass layers, a narrow diameter via could be drilled through the multilayer circuit board.

Obviously, such alternating use of different lasers would be most time consuming and uneconomical in a production environment. Accordingly, a need exists for a simple and effective technique for drilling small diameter vias through a circuit board.

SUMMARY OF THE INVENTION

The foregoing problems are overcome by the instant invention which provides a method of fabricating a circuit board having a via therethrough, comprising the steps of forming first and second aligned land areas on opposite surfaces of a dielectric substrate, each land area having a central opening therein; directing laser radiation through the central opening of the first land area to form a hole in the substrate between the openings in the first and second aligned land areas; and plating the hole to provide an electrically conductive via.

DETAILED DESCRIPTION

Figure 1:
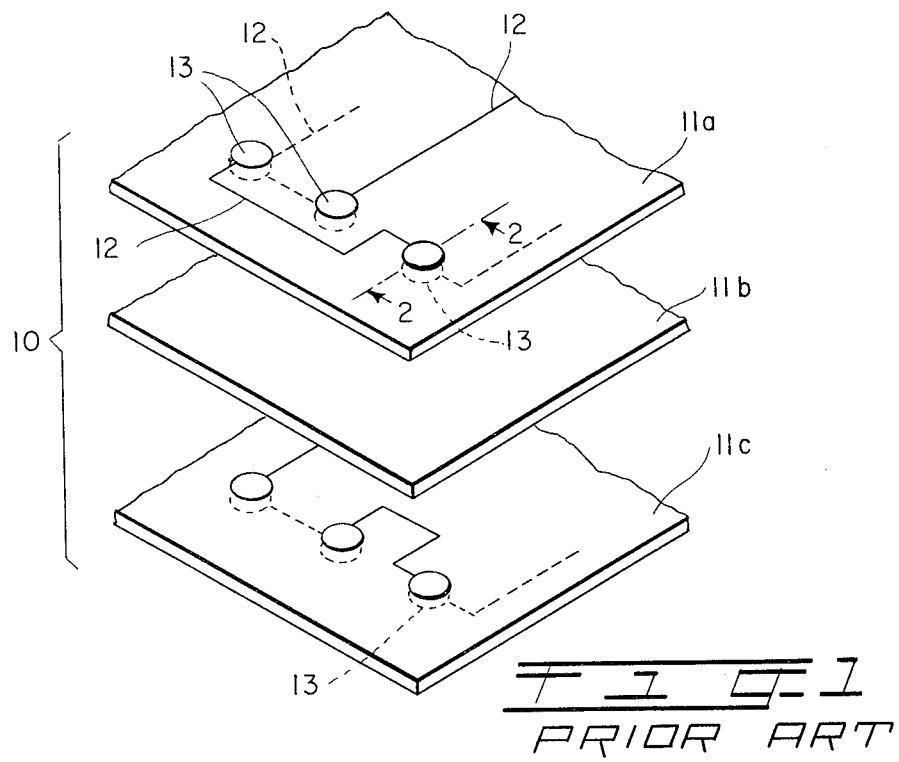
FIG. 1 is an exploded view of a multilayer circuit board.

It is to be understood that the cross-sectional views of the drawing are greatly enlarged and distorted for the sake of clarity of illustration.

FIG. 1 is a partial exploded view of a multilayer circuit board generally designated by the numeral 10. The circuit board 10 is comprised of a plurality of individual dielectric layers 11—11. The layers 11a and 11c have a multitude of conductive interconnecting leads 12—12 plated on both sides thereof, the leads terminating on a plurality of circular land areas 13—13. The layer 11b has no conductive material thereon and provides insulation between the patterns on the underside of the layer 11a and the top surface of the layer 11c.

In the prior art, the layers 11a to 11c are pressed together and heat is applied for a predetermined period of time to form a laminate. Vias are mechanically drilled in the laminate, through the central portion of the land areas 13—13 and the via so formed is then electrolessly plated to provide an electrical connection between the aligned land areas on layers 11a and 11c. Such mechanical drilling becomes very expensive when the vias to be drilled are in the range of 5 to 20 mils in diameter for the reasons hereinbefore set forth.

Figure 2:
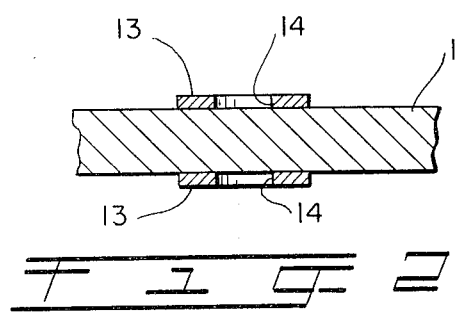
FIG. 2 is a partial cross-sectional view of one layer of the multilayer circuit board of FIG. 1 modified in accordance with the instant invention.
Figure 3:
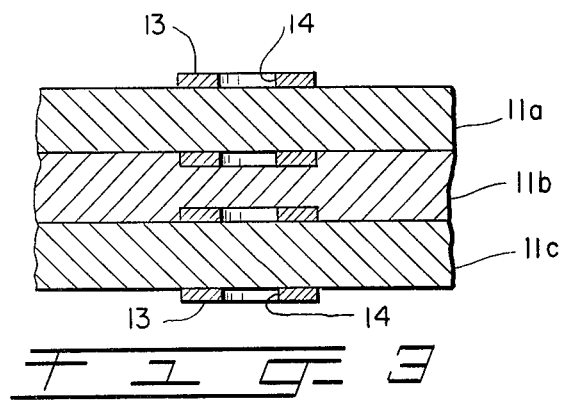
FIG. 3 is a partial cross-sectional view of a multilayer circuit board modified in accordance with the instant invention.

FIGS. 2 thrugh 5 depict the steps of the instant invention which overcome the prior art problems attendant to fabricating small diameter vias in the multilayer circuit board 10. FIG. 2 is a partial cross-sectional view of a single layer 11 having a pair of vertically aligned land areas 13—13 on the top and bottom surface thereof. The land areas 13—13 are annular in geometry having openings 14—14 therein which may be formed by any well-known selective etching or plating process. All the land areas 13—13 on the layers 11a and 11c are also selectively etched to provide apertures 14—14 therein. The layers 11—11 are then stacked, pressed together and heated for a predetermined period of time as hereinbefore described resulting in a composite laminate structure as shown in FIG. 3.

Figure 4:
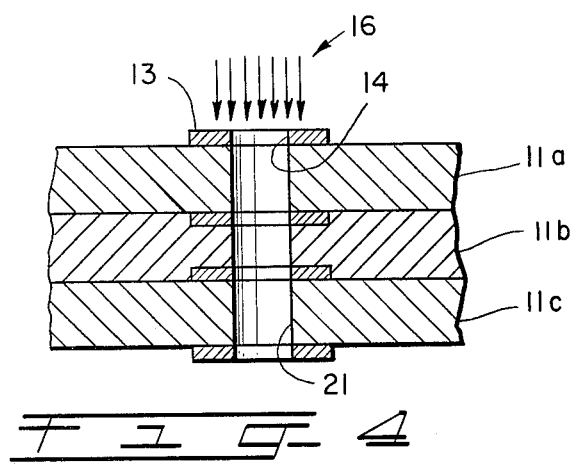
FIGS. 4 and 5 depict the laser drilling and electroless plating operations, respectively, of a via in a multilayer circuit board.
Figure 5:
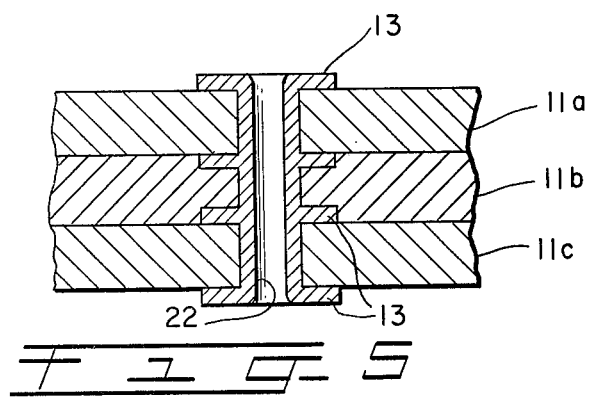

A laser beam 16 from a predetermined type of laser (e.g., $CO_2$ laser operating at a wavelength of 10.6 $\mu$m) is then directed toward the apertures 14—14 as shown in FIG. 4. The material selected for use as the land areas 13—13 (e.g., copper) reflects the radiation of the laser beam which radiation is highly absorbed by the material of the layers 11 (e.g., epoxy-glass). Thus, the land areas 13—13 act as a mask by reflecting the portion of the laser beam 16 impinging thereon while permitting the beam to pass through the opening 14 to drill through the layers 11a to 11c, removing the substrate material, to form a via 21 therethrough which provides access to the underlying land areas 13—13. Once formed, the via is then electrolessly plated with an electrically conductive material 22 (e.g., copper), shown in FIG. 5, to provide the desired connections between the land areas 13—13 on the different layers 11—11.

Figure 6:
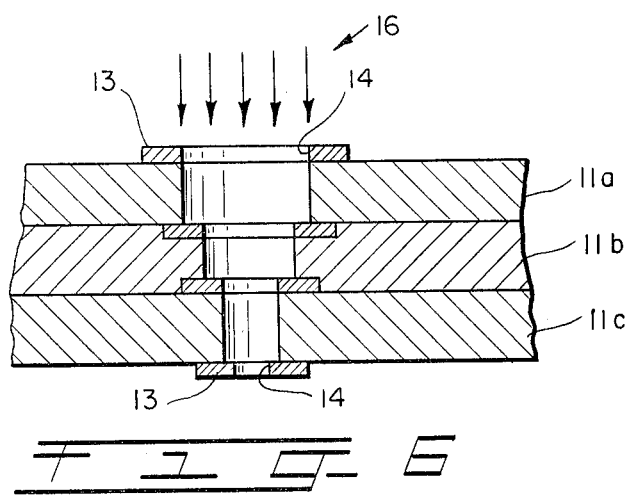
FIG. 6 is a partial cross-sectional view of a stepped via in a multilayer circuit board.

FIG. 6 depicts a further embodiment of the instant invention wherein each of the etched apertures 14—14 in a given set of vertically aligned land areas 13—13 has a smaller diameter than the one above. The laser beam 16 passing through apertures 14—14 in the land areas 13—13 will form a stepped via 21, as shown in FIG. 6. Advantageously, the stepped via 21 exposes a larger portion of the surface of the land areas 13—13 which further assures a good electrical connection to the electroless plated material 22.

Figure 7:
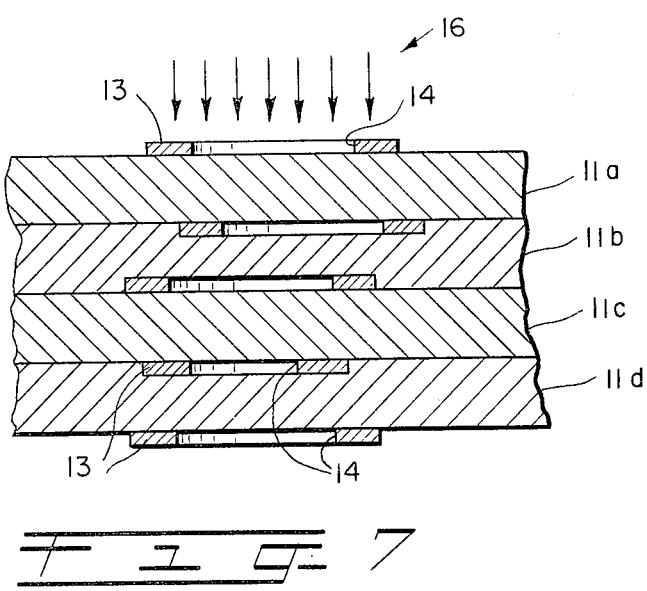
FIG. 7 is a partial cross section of a multilayer circuit board in which the land areas are misaligned.
Figure 8:
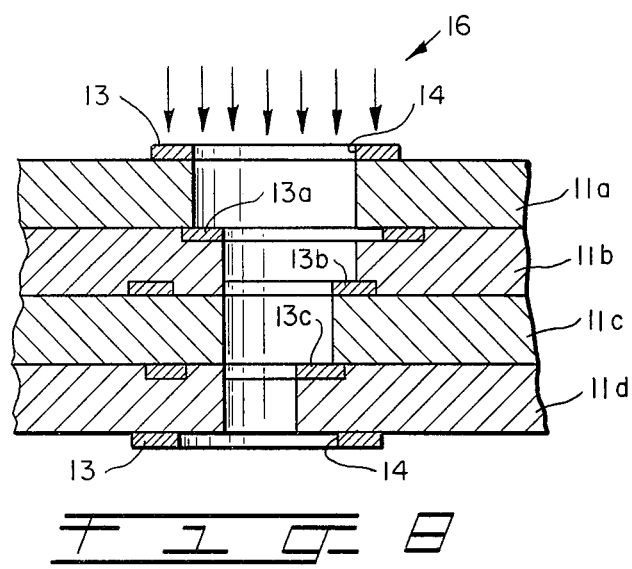
FIG. 8 depicts the laser drilling of a via through the circuit board shown in FIG. 7.
Figure 9:
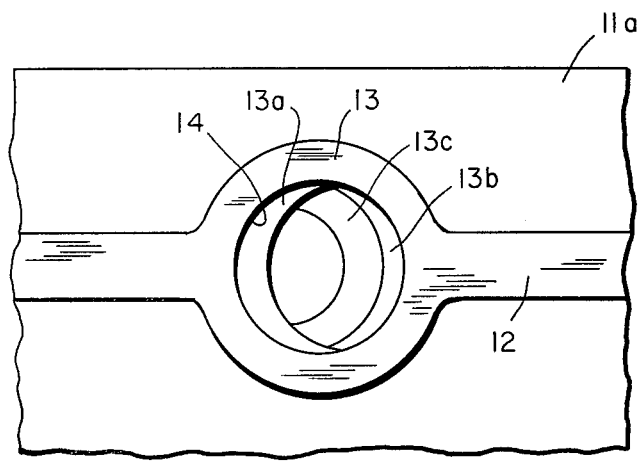
FIG. 9 is a top view of the circuit board of FIGS. 7 and 8 after a via has been drilled therethrough.

FIGS. 7 to 9 demonstrate the operation of the instant technique on a more complex multilayer board 10 which has four layers 11—11 which were misaligned slightly due to positioning errors and shrinkage factors of the materials of the multilayer board 10. As the laser beam 16 forms the via 21, the misaligned apertures 14—14 will mask the beam, resulting in a via having a reduced cross-sectional area as shown in a top view of the multilayer board 10 in FIG. 9. However, a portion of each land area 13 is exposed for the subsequent plating operation.

It will also be apparent that one skilled in the art may make various modifications and changes to the methods and apparatus disclosed herein without departing from the spirit and scope of this invention.

What is claimed is:

1. A method of fabricating a circuit board having an electrically conductive circuit pattern on both sides of a dielectric layer, the conductive pattern being formed of a material which is substantially less responsive to being drilled by laser radiation of a predetermined wavelength than is said dielectric layer and having a plurality of leads connected to land areas, the land areas on one side of the layer being aligned with the land areas on the other side of the layer, the method comprising the steps of:

forming an aperture in the land areas to expose the dielectric layer thereunder;

stacking a plurality of such conductively patterned layers alternately with unmetallized dielectric layers;

uniting the stacked layers together to form a multilayer circuit board having one or more groups of aligned land areas each having an aperture therein; and directing a beam of laser energy of the predetermined wavelength towards at least one exposed land on the outer surface of the stacked layers to drill a via in the substrate through apertures in at leat one aligned group of land areas while exposing at least a portion of at least one of the aligned land areas.

2. The method as set forth in claim 1, which is characterized by:

plating electrically conductive material in the holes to interconnect the aligned land areas.

3. The method as set forth in claim 1, wherein:

the laser is a $CO_2$ laser having a radiation wavelength of 10.6 $\mu$m;

the dielectric material is an epoxy-glass; and the conductive material is copper.

* * * * *